(12) United States Patent
Nieminen

(10) Patent No.: US 6,889,353 B2
(45) Date of Patent: May 3, 2005

(54) METHOD AND ARRANGEMENT FOR DECODING CONVOLUTIONALLY ENCODED CODE WORD

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 414 days.

(21) Appl. No.: 10/056,399

(22) Filed: Jan. 23, 2002

(65) Prior Publication Data

US 2002/0099998 A1 Jul. 25, 2002

(30) Foreign Application Priority Data

Jan. 24, 2001 (FI) ............................................. 20010147

(51) Int. Cl.[7] .............................................. H03M 13/00
(52) U.S. Cl. ...................................... 714/786; 714/755
(58) Field of Search ................................ 714/755, 786, 714/704, 752, 746, 799; 375/229, 262

(56) References Cited

U.S. PATENT DOCUMENTS

| | | | | |
|---|---|---|---|---|
| 5,721,745 A | * | 2/1998 | Hladik et al. ............... | 714/755 |
| 6,014,411 A | | 1/2000 | Wang ......................... | 375/259 |
| 6,023,783 A | | 2/2000 | Divsalar et al. ............ | 714/792 |
| 6,044,116 A | | 3/2000 | Wang ......................... | 375/265 |
| 6,138,260 A | | 10/2000 | Ketseoglou ................. | 714/751 |
| 6,263,467 B1 | | 7/2001 | Hladik et al. ............... | 714/755 |
| 6,298,463 B1 | | 10/2001 | Bingeman et al. .......... | 714/786 |
| 6,330,277 B1 | | 12/2001 | Gelblum et al. ............ | 375/222 |
| 6,530,059 B1 | * | 3/2003 | Crozier et al. .............. | 714/786 |

OTHER PUBLICATIONS

Reed et al., Turbo–code termination schemes and a novel alternative for short frames, 1996, IEEE, p. 354–358.*

* cited by examiner

*Primary Examiner*—Shelly A Chase
(74) *Attorney, Agent, or Firm*—Perman & Green, LLP

(57) ABSTRACT

The invention relates to a method and arrangement for decoding a turbo coded code word comprising termination bits. The received code word samples are applied to a decoder in a sequence required by the code structure. Termination samples are grouped according to different components of the code word, code interleavers are extended such that the extension part comprises addresses of the systematic termination samples. The address of the ascending order is formed after the actual code word samples such that the addresses of the extension part are addresses of the systematic termination samples corresponding to the termination samples of one or more parities of ascending order and those of the extrinsic weight coefficients related to said systematic termination samples. Decoding is executed by using the extended, ascending address formation and one or more extended interleavers.

16 Claims, 5 Drawing Sheets

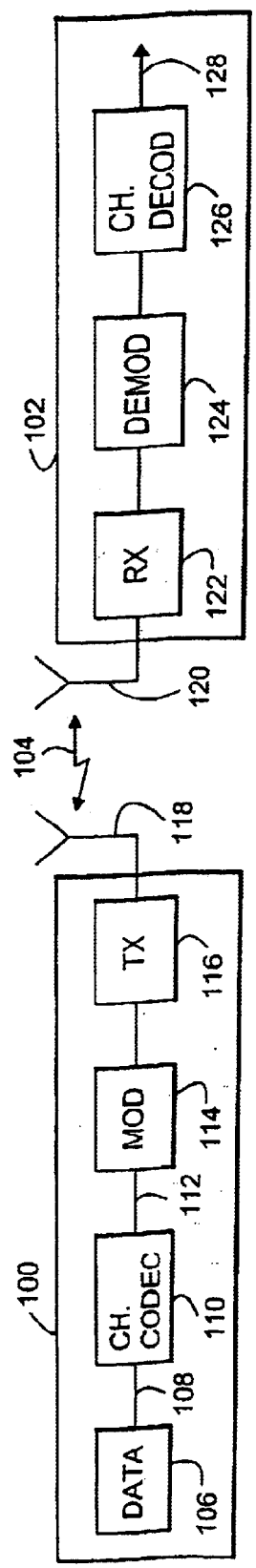
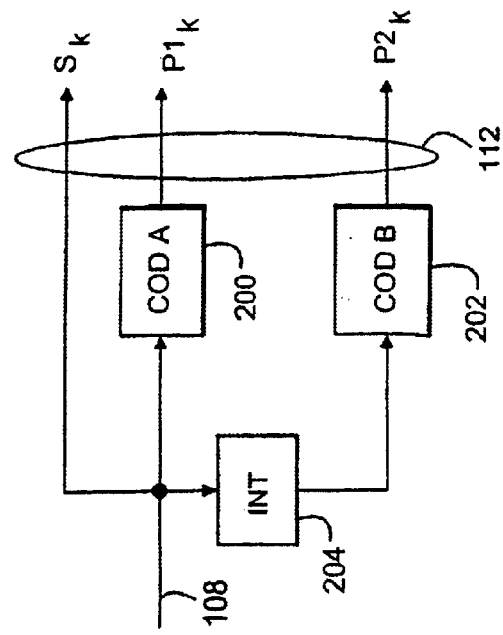
Fig. 1
Fig. 2a

METHOD AND ARRANGEMENT FOR DECODING CONVOLUTIONALLY ENCODED CODE WORD

RELATED ART

The invention relates to a method and arrangement for decoding a turbo coded code word. In particular, the invention relates to decoding a code comprising termination bits.

BACKGROUND OF THE INVENTION

In telecommunication systems, a transmission channel often causes interference to data transmission. Interference occurs in all systems, but in particular in wireless telecommunication systems the radio path attenuates and distorts the signal to be transmitted in a variety of ways. On the radio path, interference is typically caused by multipath propagation, various fades and reflections and also other signals transmitted on the same radio path.

To reduce the effects of interference various encoding methods have been developed, which aim to protect the signal from interference and which also aim to eliminate interference-induced errors in the signal. One widely used encoding method is convolutional coding. In the convolutional coding the signal to be transmitted, consisting of symbols, is encoded into code words which are based on the convolution of the original signal with code polynomials. The convolutional code is determined by the coding rate and the coding polynomials. The coding rate (k/n) refers to the number (n) of produced coded symbols in relation to the number (k) of symbols to be coded. The encoder is often implemented by means of shift registers. The constraint length K of the code often refers to the length of the shift register. The encoder can be considered a state machine having $2^k$ states.

One encoding method further developed from the convolutional code is a parallel concatenated convolutional code PCCC, which is also known as a turbo code. One way to generate a PCCC code is to use two recursive systematic convolutional encoders and an interleaver. The convolutional encoders can be identical or different. The resulting code comprises a systematic part which corresponds directly to the symbols at the encoder input and two parity components which are the outputs of the parallel convolutional encoders.

It is advantageous in practical implementations if the initial and final states of the encoder are previously known. Therefore, the coding is often started at a given state and finished at a predetermined known state. In coding this encoder transition to a known, predetermined final state is called termination, and the bits to be encoded during the transition, the bits not being actual data, are called termination bits. The initial state often comprises only zero bits, and likewise, the termination transfers the encoder back to the zero state. However, this is not always necessary.

The function of the receiver, in turn, is to decode the coded signal that has propagated over the radio path and often distorted in a variety of ways. In general, the convolutional code is decoded by means of a so-called state diagram, i.e. trellis, which corresponds to the state machine of the encoder. The trellis presents the states of the encoder and the transitions between the states with necessary code words.

The target of the decoder is to determine the sequential states of the encoder, i.e. the transitions from one state into another. To determine the transitions, the decoder calculates so-called branch metrics which describe probabilities of different transitions. The branch metrics are proportional to the logarithms of transition probabilities. Hence, the sums of the metrics correspond to the mutual products of the probabilities. Low metrics correspond to high probability.

In some turbo coding methods, termination bits of code components are code-component-specific. This has a result that the termination bits of the code components of the code word require a different treatment from the rest of the code component. This is the case in particular if the termination method does not apply a turbo-code interleaver to the termination bits. The samples corresponding to the termination bits are called termination samples at the receiver end: the receiver does not know the original termination bits (nor any other transmitted bits), because the radio path has distorted the received code word.

In general, the decoding algorithms of the turbo codes cannot utilize received code word samples remaining outside the effect of the interleaver, because these samples do not belong to the actual code word of the turbo code. Consequently, the samples corresponding to the termination bits, i.e. termination samples, have to be decoded in another manner than the samples of the actual code word.

BRIEF DESCRIPTION OF THE INVENTION

The object of the invention is thus to provide a method and an arrangement implementing the method such that a convolutional code comprising termination bits can be decoded advantageously. This is achieved with a method for decoding a turbo-coded code word comprising termination bits, in which method received code word samples are stored in a memory for decoding, the samples are applied to a decoder in a sequence required by the code structure, termination samples are grouped according to different code word components, one or more interleavers of the code are extended such that the extension part comprises addresses of systematic termination samples corresponding to termination samples of one or more parity components associated with each interleaver and addresses of extrinsic weight coefficients related to said systematic termination samples, an address of ascending order is formed after the samples of the actual code word such that the addresses of the extension part are ascending-order addresses of the extrinsic weight coefficients or of systematic termination samples corresponding to termination samples of one or more parities, and decoding is executed by using extended ascending address formation or one or more extended interleavers.

The invention also relates to an arrangement for decoding a turbo coded code word comprising non-interleaved termination bits, the arrangement comprising a memory for storing received code word samples, means for reading the samples into a decoder in a sequence required by the code structure. The arrangement comprises means for grouping the termination samples according to different components of the code word, means for extending one or more interleavers of the code such that the extension part comprises addresses of systematic termination samples corresponding to termination samples of one or more parity components associated with each interleaver and addresses of extrinsic weight coefficients related to said systematic termination samples, means for forming an address of ascending order after the samples of the actual code word such that the addresses of the extension part are ascending-order addresses of the extrinsic weight coefficients or of systematic termination samples corresponding to termination samples of one or more parities, and means for executing the decoding by using the extended ascending address formation and one or more extended interleavers.

Several advantages are achieved with the solution of the invention. In the arrangement according to the preferred embodiments of the invention, the decoder need not treat the termination samples as exceptional cases. In particular the invention is useful in connection with termination methods which do not apply a turbo interleaver to the termination bits of the code word.

In the solution according to the preferred embodiments of the invention the code components can be decoded with the same decoder irrespective of which code component is decoded with the proviso that the encoders of the code components are the same. The code components encoded with different polynomials need naturally be decoded with the decoders corresponding to the polynomials, but even in this case the solution of the invention makes the treatment of the termination samples uniform.

BRIEF DESCRIPTION OF THE DRAWINGS

In the following the invention will be described in greater detail in connection with the preferred embodiments, with reference to the attached drawings, wherein FIG. 1 is an example of a convolutional encoder transmitter and a receiver whereto the solution of the invention can be applied;

FIGS. 2a, 2b and 2c illustrate an example of the structure of a turbo encoder and a turbo decoder;

DESCRIPTION OF PREFERRED EMBODIMENTS

Figure 2B:
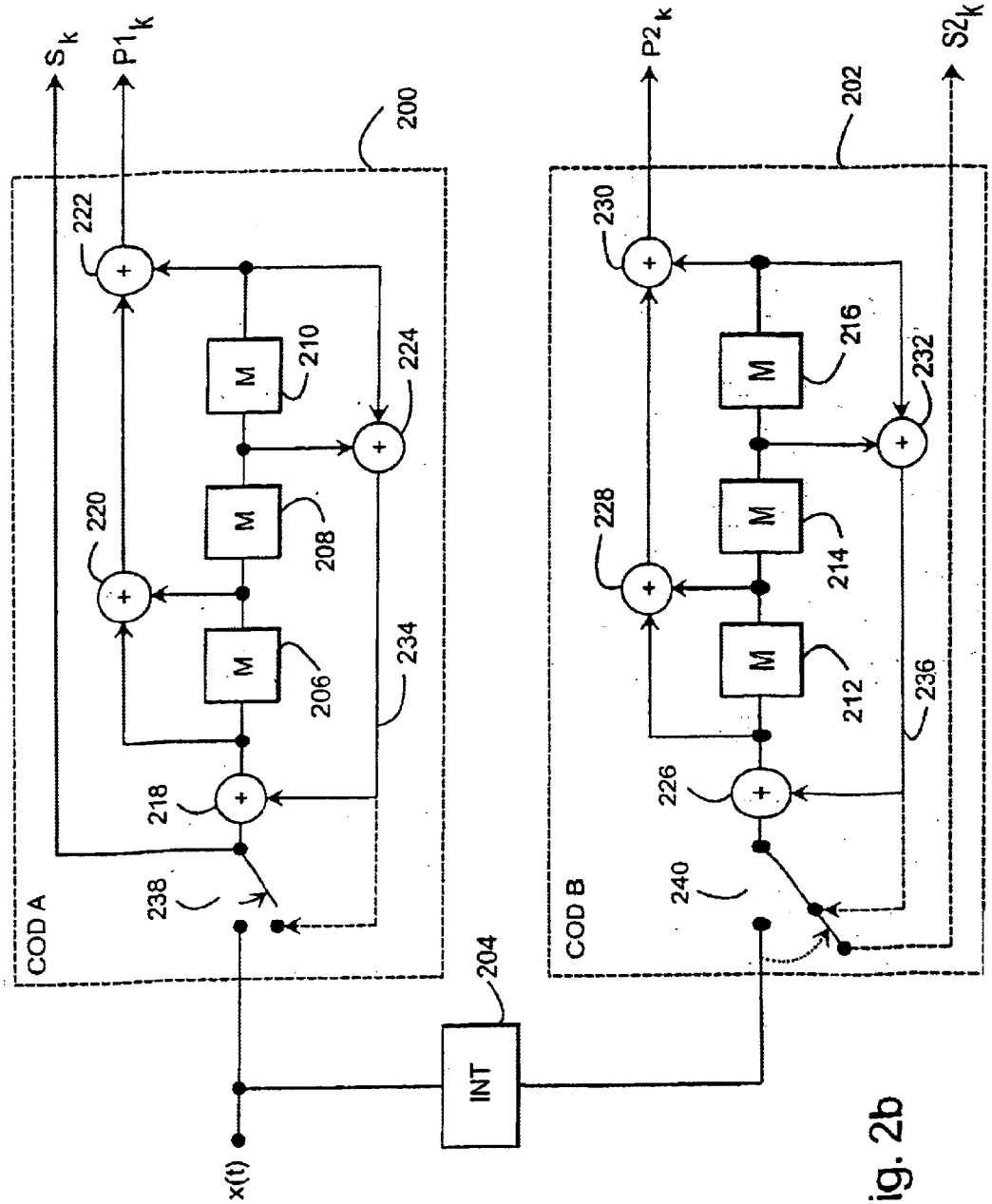

With reference to FIG. 1, let us first examine an example of a transmitter 100 and a receiver 102, in connection with which the solution according to the preferred embodiments of the invention can be applied. In the example of FIG. 1, the transmitter 100 and the receiver 102 communicate by means of a radio channel 104. The transmitter 100 comprises a data source 106, which can be a speech encoder or any other data source. The output of the data source provides a transmitted signal 108 which is applied to a channel encoder 110, which in this case is a convolutional coder, preferably a turbo coder. The encoded symbols 112 are applied to a modulator 114, where the signal is modulated in a known manner. The modulated signal is applied to radio frequency parts 116, where it is amplified and transmitted to a radio path 104 by means of an antenna 118.

On the radio path 104, the signal is subjected to interference and typically also noise. The receiver 102 comprises an antenna 120, by which it receives the signal that is applied via the radio frequency parts 122 to a demodulator 124. The demodulated signal is applied to a channel decoder 126, where the signal is decoded according to the preferred embodiments of the invention. From the decoder the decoded signal 128 is further applied to other parts of the receiver.

FIG. 2a illustrates the structure of a typical turbo coder. The encoder comprises two encoders 200, 202 and an interleaver 204. The signal 108 to be coded is applied as such to the encoder output. This component is called a systematic part S of the code. The signal to be coded is also applied as such to a first encoder A 200 and an interleaver 204. The interleaved signal is applied to a second encoder B 202. The output signal P1 of the first encoder and the output signal P2 of the second encoder are called parity components of the code; P1 is a parity of the ascending order and P2 is a parity of the interleaved order. The ascending order refers to the address order in which the bits enter the encoder A 200. The interleaved order is the order in which the bits enter the encoder B 202. The encoders A and B can be either identical or different. They have a prior art structure.

One example of the encoder structure is studied in greater detail by means of FIG. 2b particularly in view of termination. Typically, both the first and the second encoders 200, 202 consist of a shift register, i.e. subsequent memory locations 206 to 216, between which there are various connections either directly or via summing or subtracting means 218 to 232. In this example, both encoders are identical but this is not always necessarily the case. After the actual code word data bits have ended, the encoder is rendered in the same state as at the beginning of the code word. This termination takes place, for instance, using the solution of the figure, in which the feedback line 234, 236 of the encoder is applied to the encoder input by means of a switch 238, 240. First, the switch 238 of the encoder 200 is set in a termination position, i.e. such that the feedback line 234 also has a connection to the input of the encoder 200. In particular, two identical bits are inputted in an XOR summer 218, which results in a zero bit. At the same time, the encoder 202 is inactive. After three rounds the encoder 200 is stopped and the encoder 202 is set in a termination state, i.e. its feedback line 236 is connected with the switch 240 to the input of the encoder 202 and the systematic bits are obtained at the output S2. Likewise, after three rounds the encoder 202 is set in the zero state.

If the contents of the memory elements 206, 208 and 210 are (a, b, c) at the beginning of termination of the encoder 200, the final result is as follows:

(systematic component) S: b xor c, a xor b, a;

(parity component) P1: a xor c, b, a.

The corresponding result applies to the encoder 202, but the systematic bits are obtained at point S2. The systematic bits obtained in connection with the termination are called systematic termination bits corresponding to said parity bits. The order of the termination bits at the end of the code word can be e.g. as follows:

$S_N, P1_N, S_{N+1}, P1_{N+1}, S_{N+2}, P1_{N+2}, S2_N, P2_N, S2_{N+1}, P2_{N+1}, S2_{N+2}, P2_{N+2};$ where N is the number of the data bits to be coded.

Figure 2C:
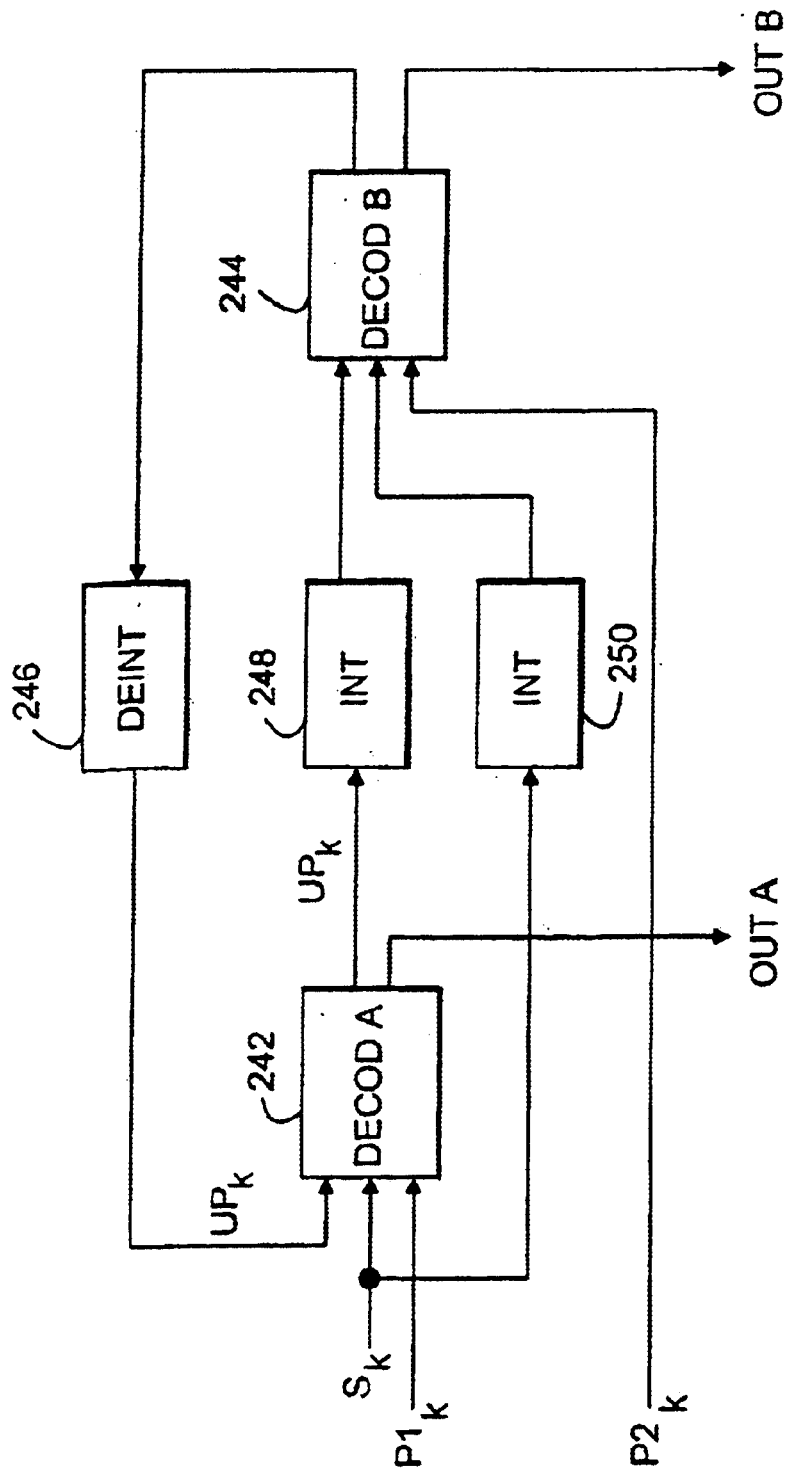

FIG. 2c illustrates the general structure of a typical turbo decoder in the case of a 1/3 code. The decoder is inputted with the systematic component $S_k$ and parity components $P1_k$ and $P2_k$ of the code. The decoder comprises two decoder units, a first unit A 242 and a second unit B 244. The first unit is inputted with the code's systematic component $S_k$, parity component $P1_k$ and the extrinsic weight coefficient $UP_k$ from a previous iteration round. The weight coefficient comes from the output of the second unit B 244 through a de-interleaver 246. At the output of the first unit A 242 there is a new extrinsic weight coefficient $UP_k$ which is applied to other parts of the receiver when necessary. The second unit B is further inputted with the code's systematic component $S_k$ through the interleaver 250 and the parity component $P2_k$. The unit output comprises the new extrinsic weight coefficient $UP_k$ which is applied through the de-interleaver 246 to the first unit 242 and an output B which comprises a soft and a hard decisions and which is applied to other parts of the receiver when necessary.

In practice, the interleavers 248 and 250 are often implemented by one interleaver. The decoder can also be implemented as a parallel implementation. In that case the decoder units 242 and 244 are implemented by parallel decoders.

MaxLogMap calculation to be carried out in the decoder units consists of three main parts: forward-going path metric calculation, backwardgoing path metric calculation and a combination of forward and backward calculated path metrics for calculating a new extrinsic weight coefficient and a soft and a hard decisions. The new extrinsic weight coefficient is applied to a next iteration round as an input parameter, while the hard bit decision is made from the sign of the soft decision.

An example of the operation of the decoder is studied next in connection with the treatment of the termination samples. The code word samples received in the receiver are stored in a memory for decoding. The samples are applied to the decoder in a sequence required by the code structure. The code consists of a plurality of code components, such as a systematic component and parity components. In the solution according to the preferred embodiment of the invention the termination samples are grouped according to different code word components. Further, when extrinsic weight coefficients are calculated, the extrinsic weight coefficients corresponding to the termination samples of different parity components are positioned after the extrinsic weight coefficients of the actual code word. One or more interleavers of the code are extended such that the extended part comprises the addresses of the extrinsic weight coefficients and those of the systematic termination samples corresponding to the termination samples of the parity associated with each interleaver. The address space of the ascending order is extended by adding to the extension part the addresses of the extrinsic weight coefficients and those of the systematic termination samples corresponding to the termination samples of the parity of the ascending order.

Typically, the turbo code can be decoded code component by code component iteratively. In connection with MaxLogMap, LogMap or Map, the code component decoding employs, in the order defined by the code component, systematic code word samples, samples of the code component parity part and extrinsic weight coefficients obtained from a previous round. The turbo code is decoded both in direct and in interleaved order, and component decoding can be executed either in parallel or in serial. Let us assume that the length of the turbo code interleaver is N and the uncoded bits are numbered 0, 1, . . . , N−1. In the direct order, the number of the termination bits of the encoded code word component is denoted by A, which equals the memory length of the encoder used and in the interleaved order the number of the termination bits of the encoded code component is denoted by B. Thus, the total length of the code word, the termination bits included, is 3*N+2*A+2*B, the length of the actual code word being 3*N. The length of each code word component, without the termination bits, is N.

An example of extending the ascending order and the interleaved order is studied. In decoding in the direct order, the addresses to the extrinsic weight coefficients, systematic components and parity components are as follows:

ewc: 0, 1, 2, . . . , N−1, N, N+1, . . . , N+A−1;

sys: 0, 1, 2, . . . , N−1, N, N+1, . . . , N+A−1;

par: 0, 1, 2, . . . , N−1, N, N+1, . . . , N+A−1.

The extension component of the address space of the ascending order is in italicized bold-type.

In decoding in the interleaved order, the addresses to the extrinsic weight coefficients, systematic components and parity components are as follows:

ewc: F(0), F(1), . . . , F(N−1), F(N), F(N+1), . . . , F(N+B−1);

sys: F(0), F(1), . . . , F(N−1), F(N), F(N+1), . . . , F(N+B−1);

par: 0, 1, 2, . . . , N−1, N, N+1, . . . , N+B−1;

where F denotes an interleaver and F an extension component whose contents can read for example:

F(N)=N+A; F(N+1)=N+A+1; . . . ; F(N+B−1)=N+A+B−1.

Figure 3:
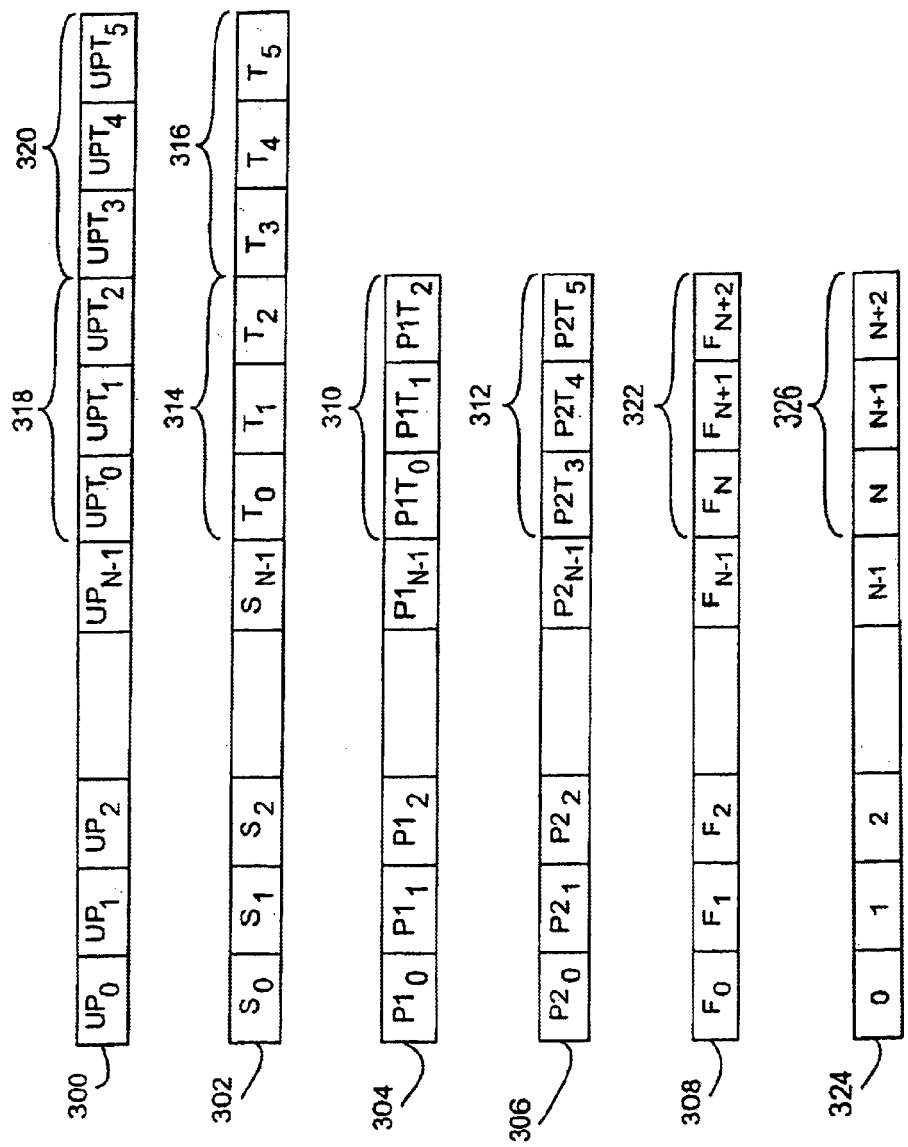
FIG. 3 illustrate memory treatment according to the preferred embodiments of the invention.

In this solution according to the preferred embodiment of the invention it is assumed that the systematic component of the termination of code components is placed in the memory after the actual systematic component as shown in FIG. 3. In other words, the systematic termination samples (314) corresponding to the parity component of the ascending order are immediately after the systematic samples of the actual code word, which are followed by the systematic termination samples (316) corresponding to the interleaved parity component. The addresses of the extrinsic weight coefficients calculated by the turbo decoder can be generated in the same manner as the addresses of the systematic component.

Let us examine another manner to extend the ascending and the interleaved orders: the systematic termination samples of the interleaved order are placed immediately after the actual systematic samples. Now, in decoding in direct order, the addresses to the extrinsic weight coefficients, the systematic components and the parity components are as follows:

ewc: 0, 1, 2, . . . , N−1, *N+B, N+B+1, . . . , N+B+A−1*;

sys: 0, 1, 2, . . . , N−1, *N+B, N+B+1, N+B+A−1*;

par: 0, 1, 2, . . . , N−1, *N+B, N+B+1, . . . , N+B+A−1*.

The extension part of the address space of the ascending order is in italicized bold-type. This differs from the corresponding point in the previous example.

In decoding in the interleaved order, the addresses to the extrinsic weight coefficients, the systematic component and the parity components are:

ewc: F(0), F(1), . . . , F(N−1), F(N), F(N+1), . . . , F(N+B−1);

sys: F(0), F(1), . . . , F(N−1), F(N), F(N+1), . . . , F(N+B−1);

par: 0, 1, 2, . . . , N−1, N, N+1, . . . , N+B−1;

where F denotes an interleaver and F an extension part whose contents in this case can read for example:

F(N)=N; F(N+1)=N+1; . . . ; F(N+B−1)=N+B−1;

which differs from the previous example, because the systematic termination samples are grouped in a different manner. It is obvious to a person skilled in the art that there are also other possibilities.

FIG. 3 is examined, which illustrates the sample positioning in the memory. The topmost bar 300 thus comprises the extrinsic weight coefficients, i.e. the numerical values of the turbo feedback, and then in due order the samples of the systematic component 302 S, the first parity component 304 P1k and the second parity component 306 $P2_k$. The second last bar 308 illustrates the turbo interleaver and the extension part 322 thereof. The last bar 324 illustrates the ascending order and the extension part 326 thereof. It is assumed here that the length of the original uncoded data is N bits and the length of the turbo encoder memory is three, as in FIG. 2b. The memory locations 0, 1, . . . , N−1 contain an actual code word, to which the turbo interleaver is applied as such. In the third bar 304, the memory locations 310 (P1T$_0$ to P1T$_2$) contain the termination samples of the first parity component, i.e. of the parity of the ascending order. In the fourth bar 306 the memory locations 312 (P2T$_3$ to P2T$_5$) contain the samples of the second parity component, i.e. of the parity associated with the interleaver. In the second bar 302, the memory locations 314 (T$_0$ to T$_2$) contain the samples of the systematic component corresponding to the termination samples of the first parity component, and correspondingly, the memory locations 316 (T$_3$ to T$_5$) contain the samples of the systematic component corresponding to the termination bits of the second parity component. Further, in the first bar 300, the locations 318 (UPT$_0$ to UPT$_2$) contain the extrinsic weight coefficients corresponding to the termination samples of the first parity component, and in the locations 320 (UPT$_3$ to UPT$_5$) contain the extrinsic weight coefficients corresponding to the termination samples of the second parity component.

In the solution according to the preferred embodiment of the invention, one or more interleavers of the code are extended such that the extended part contains the addresses of the extrinsic weight coefficients and of the systematic termination samples corresponding to the termination samples of the parity associated with each interleaver. The address of the ascending order is formed after the actual data samples such that the addresses are those of the extrinsic weight coefficients and of the systematic termination samples of the ascending-order parity. Thus, decoding is carried out using extended, ascending address formation and one or more extended interleavers.

In the solution according to the preferred embodiment of the invention the interleaver, or the interleavers if they are several, and the ascending order are extended such that each extension part designates the location of the sample of the systematic component of the code and the extrinsic weight coefficient in the same order as the termination is executed.

Figure 4:
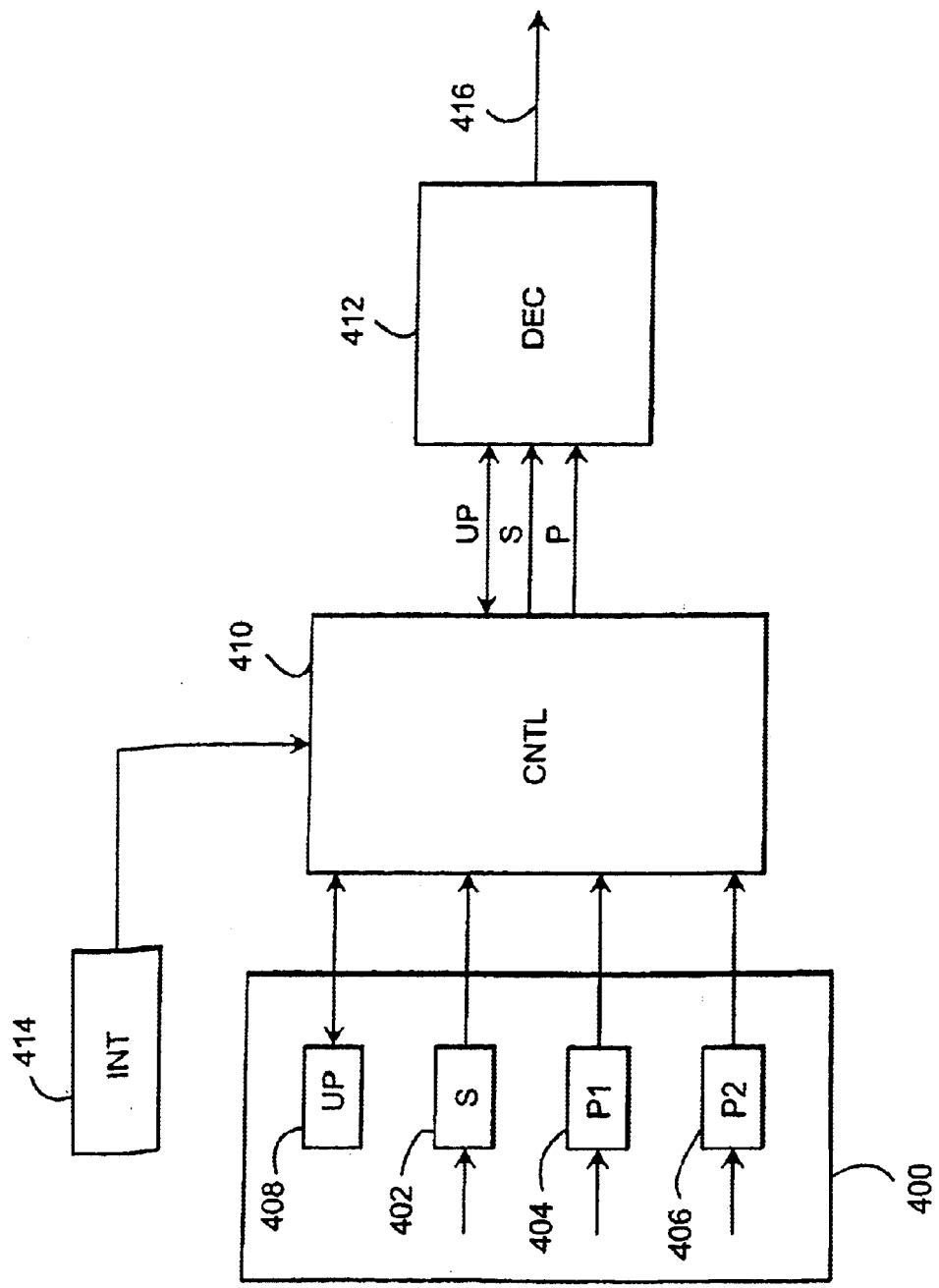
FIG. 4 illustrates a decoder solution according to the preferred embodiments of the invention.

Next is studied FIG. 4 which illustrates an example of the arrangement according to the preferred embodiment of the invention. The figure shows a memory 400 for storing received code word samples. The memory comprises specific blocks for a systematic component 402, for a first and a second parity components 404, 406 and for an extrinsic weight coefficient 408 to be calculated reiteratedly. The arrangement further comprises a multiplexer and control unit 410, which is arranged to read the samples into a decoder 412 from the memories 402 to 408 in a sequence required by the code structure and coding phase. From the decoder, the decoded bits 416 are further applied to other parts of the receiver.

The control unit 410 reads the samples of the code word to be decoded from the memories 402 to 408 according to the different code word components. The termination samples of the parity components are placed in the memories 404 and 406 after the samples of the actual code word parities. The samples corresponding to the termination samples of the different parity components of the systematic component are, in turn, placed in the memory 402 after the actual code word samples. When the extrinsic weight coefficient is calculated, the old extrinsic weight coefficient applied to the decoder and a new extrinsic weight coefficient coming from the decoder are placed in the memory 408. The interleaving unit 414 provides address information on the addresses required by interleaving, i.e. in which order the interleaved samples are applied to the decoder. The control unit 410 extends the interleaver such that the extended part comprises the addresses of the extrinsic weight coefficients and of the systematic components corresponding to the termination samples of each parity component used. The control unit 410 extends the address space of the ascending order after the actual code word samples such that the addresses of the extension part are those of the extrinsic weight coefficients of the systematic termination samples corresponding to the termination samples of the ascending-order parity.

Even though the invention is described in the above with reference to the example of the attached drawings, it is obvious that the invention is not restricted thereto but it can be modified in a variety of ways within the inventive idea disclosed in the accompanying claims.

What is claimed is:

1. A method for decoding a turbo-coded code word comprising termination bits, the method comprising
   storing received code word samples in a memory for decoding, the code word sample comprising samples of the actual code word and termination samples corresponding to the termination bits of the code word,
   applying the samples to a decoder in a sequence required by a code structure,
   grouping the termination samples according to different code word components,
   extending one or more interleavers of the code word such that the extension part comprises addresses of systematic termination samples corresponding to termination samples of one or more parity components associated with each interleaver and addresses of extrinsic weight coefficients related to said systematic termination samples,
   forming an address of ascending order after the samples of the actual code word such that the addresses of the extension part are ascending-order addresses of the extrinsic weight coefficients or of the systematic termination samples corresponding to the termination samples of one or more parities, and
   executing decoding by using extended ascending address formation or one or more extended interleavers.

2. A method as claimed in claim 1, where in the systematic termination samples corresponding to the termination samples the different parity components are placed in a memory after the systematic samples of the actual code word.

3. A method as claimed in claim 1, where the extrinsic weight coefficients corresponding to the termination samples and the different parity components are placed in a memory after the extrinsic weight coefficients of the actual code word.

4. A method as claimed in claim 1, where in the ascending order one or more interleavers are extended such that each extension part designates the places of the systematic samples of the code word and those of the extrinsic weight coefficients in the same order as the termination is executed.

5. A method as claimed in claim 1, where the termination samples the different parity components are grouped in the memory immediately after the actual parity samples.

6. A method as claimed in claim 1, where in the systematic termination samples corresponding to the termination samples the different parity components are at the end of the samples of the systematic component in the successive order by groups according to each parity component.

7. A method as claimed in claim 1, where in the systematic termination samples corresponding to the termination samples the different parity components are grouped at the end of the samples of the systematic component such that the systematic samples of the ascending order corresponding to the termination samples of one or more parities come first and thereafter the systematic samples of each interleaver corresponding to the termination samples of one or more parities grouped according to the parity components.

8. A method as claimed in claim 7, where in the memory, the extrinsic weight coefficients are grouped in the same manner as the systematic samples, the termination part included.

9. An arrangement for decoding a turbo coded code word comprising non-interleaved termination bits, the arrangement comprising
- a memory for storing received code word samples,
- means for reading the samples into a decoder in a sequence required by the code structure,
- means for grouping the termination samples according to different components of the code word,
- means for extending one or more interleavers of the code such that the extension part comprises addresses of systematic termination samples corresponding to termination samples of one or more parity components associated with each interleaver and addresses of extrinsic weight coefficients related to said systematic termination samples,
- means for forming an address of ascending order after the samples of the actual code word such that the addresses of the extension part are ascending-order addresses of the extrinsic weight coefficients or of systematic termination samples corresponding to termination samples of one or more parities, and
- means for executing the decoding by using the extended ascending address formation and one or more extended interleavers.

10. An arrangement as claimed in claim 9, the arrangement further comprising means for placing the systematic termination samples corresponding to the termination samples and of the different parity components in the memory after the systematic samples of the actual code word.

11. An arrangement as claimed in claim 9, the arrangement further comprising means for placing the extrinsic weight coefficients corresponding to the termination samples and of the different parity components in the memory after the extrinsic weight coefficients of the actual code word.

12. An arrangement as claimed in claim 9, the arrangement further comprising means for extending one or more interleavers of the code such that each extension part designates the locations of the systematic samples of the termination component of the code word and those of the extrinsic weight coefficients in the same order as the termination is executed.

13. An arrangement as claimed in claim 9, the arrangement further comprising means for arranging the termination samples of the different parity components in the memory immediately after the actual parity samples.

14. An arrangement as claimed in claim 9, the arrangement further comprising means for arranging in the memory the systematic termination samples corresponding to the termination samples of the different parity components at the end of the samples of the systematic component in the successive order by groups according to each parity component.

15. An arrangement as claimed in claim 9, the arrangement further comprising means for arranging the systematic termination samples corresponding to the termination samples of the different parity components at the end of the samples of the systematic component grouped such that the systematic samples of the ascending order corresponding to the termination samples of one or more parities come first and thereafter the systematic samples of each interleaver corresponding to the termination samples of one or more parities grouped according to the parity components.

16. An arrangement as claimed in claim 15, the arrangement further comprising means for arranging the memory of the extrinsic weight coefficients in the same manner as the memory of the systematic samples, the termination component included.

* * * * *